US010506715B2

(12) United States Patent
Coleman et al.

(10) Patent No.: US 10,506,715 B2
(45) Date of Patent: Dec. 10, 2019

(54) SCALABLE FABRICATION TECHNIQUES AND CIRCUIT PACKAGING DEVICES

(71) Applicant: The Regents of the University of California, Oakland, CA (US)

(72) Inventors: Todd Prentice Coleman, La Jolla, CA (US); Yun Soung Kim, San Diego, CA (US); Michael Bajema, San Diego, CA (US); Robert N. Weinreb, Rancho Santa Fe, CA (US)

(73) Assignee: The Regents of the University of California, Oakland, CA (US)

(*) Notice: Subject to any disclaimer, the term of this patent is extended or adjusted under 35 U.S.C. 154(b) by 95 days.

(21) Appl. No.: 15/105,350

(22) PCT Filed: Dec. 19, 2014

(86) PCT No.: PCT/US2014/071741
§ 371 (c)(1),
(2) Date: Jun. 16, 2016

(87) PCT Pub. No.: WO2015/095836
PCT Pub. Date: Jun. 25, 2015

(65) Prior Publication Data
US 2016/0330837 A1 Nov. 10, 2016

Related U.S. Application Data

(60) Provisional application No. 61/918,554, filed on Dec. 19, 2013.

(51) Int. Cl.
*H05K 1/00* (2006.01)
*H05K 1/11* (2006.01)
(Continued)

(52) U.S. Cl.
CPC .......... *H05K 1/118* (2013.01); *H01L 21/4853* (2013.01); *H01L 21/4857* (2013.01);
(Continued)

(58) Field of Classification Search
CPC ....... H01L 2224/82106; H01L 2224/97; H01L 2224/82; H01L 21/4853; H01L 21/4857;
(Continued)

(56) References Cited

U.S. PATENT DOCUMENTS 5,353,498 A * 10/1994 Fillion ................. H01L 21/568
257/E21.505
5,452,182 A 9/1995 Eichelberger et al.
(Continued)

FOREIGN PATENT DOCUMENTS

DE 102007017831 A1 10/2008
FR 2818804 A1 6/2002
(Continued)

OTHER PUBLICATIONS

Hu et al., "Stretchable Inorganic-Semiconductor Electronic Systems", Adv, Mater., 2011, pp. 2933-2936.
(Continued)

*Primary Examiner* — Yuriy Semenenko
(74) *Attorney, Agent, or Firm* — Perkins Coie LLP

(57) ABSTRACT

Disclosed are highly scalable fabrication methods for producing electronic circuits, devices, and systems. In one aspect, a fabrication method includes attaching an electronic component at a location on a substrate including a flexible and electrically insulative material; forming a template to encase the electronic component by depositing a material in a phase to conform on the surfaces of the electronic component and the substrate, and causing the material to change to solid form; and producing a circuit or electronic device by forming openings in the substrate to expose conductive (Continued)

portions of the electronic component, creating electrical interconnections coupled to at least some of the conductive portions in a selected arrangement on the substrate, and depositing a layer of an electrically insulative and flexible material over the electrical interconnections on the substrate to form a flexible base of the circuit, in which the produced circuit or electronic device is encased.

20 Claims, 9 Drawing Sheets

(51) Int. Cl.
  *H01L 23/14*  (2006.01)
  *H01L 23/538*  (2006.01)
  *H01L 21/48*  (2006.01)
  *H05K 1/18*  (2006.01)
  *H05K 3/46*  (2006.01)
  *H01L 23/00*  (2006.01)
  *H01L 21/56*  (2006.01)
  *H05K 1/03*  (2006.01)
  *H05K 3/30*  (2006.01)
  *H01L 33/62*  (2010.01)
  *H05K 1/02*  (2006.01)

(52) U.S. Cl.
  CPC ........... *H01L 21/56* (2013.01); *H01L 23/145* (2013.01); *H01L 23/5387* (2013.01); *H01L 23/5389* (2013.01); *H01L 24/24* (2013.01); *H01L 24/82* (2013.01); *H01L 33/62* (2013.01); *H05K 1/0393* (2013.01); *H05K 1/189* (2013.01); *H05K 3/303* (2013.01); *H05K 3/465* (2013.01); *H05K 3/4644* (2013.01); *H05K 3/4682* (2013.01); *H01L 24/25* (2013.01); *H01L 2224/2402* (2013.01); *H01L 2224/24011* (2013.01); *H01L 2224/24101* (2013.01); *H01L 2224/24137* (2013.01); *H01L 2224/25175* (2013.01); *H01L 2224/82005* (2013.01); *H01L 2224/82051* (2013.01); *H01L 2224/82106* (2013.01); *H01L 2224/82951* (2013.01); *H01L 2224/97* (2013.01); *H01L 2933/0066* (2013.01); *H05K 1/025* (2013.01); *H05K 2201/0154* (2013.01); *H05K 2201/0162* (2013.01); *H05K 2201/026* (2013.01); *H05K 2201/0209* (2013.01); *H05K 2201/10037* (2013.01); *H05K 2201/10106* (2013.01); *H05K 2201/10121* (2013.01); *H05K 2201/10151* (2013.01); *H05K 2201/10166* (2013.01); *H05K 2201/10174* (2013.01); *H05K 2201/10522* (2013.01); *H05K 2203/0173* (2013.01); *H05K 2203/1316* (2013.01); *H05K 2203/1469* (2013.01)

(58) Field of Classification Search
  CPC ........... H01L 21/56; H01L 2224/24011; H01L 2224/2402; H01L 2224/24101; H01L 2224/24137; H01L 2224/25175; H01L 2224/82005

See application file for complete search history.

(56) References Cited

U.S. PATENT DOCUMENTS

| | | | | |
|---|---|---|---|---|
| 6,154,366 | A * | 11/2000 | Ma | H01L 23/5389 257/700 |
| 2007/0007637 | A1* | 1/2007 | Marinov | H01L 23/13 257/686 |
| 2009/0152662 | A1* | 6/2009 | Chen | H01L 27/14618 257/433 |
| 2010/0295169 | A1* | 11/2010 | Yow | H01L 23/13 257/698 |
| 2013/0229776 | A1* | 9/2013 | Ma | H05K 1/185 361/749 |
| 2014/0238592 | A1* | 8/2014 | Marinov | H01L 24/83 156/272.8 |
| 2014/0264933 | A1* | 9/2014 | Yu | H01L 21/768 257/774 |

FOREIGN PATENT DOCUMENTS

JP  H07-007134 A  1/1995
WO  2012142177 A2  10/2012

OTHER PUBLICATIONS

Li et al., "Wafer-Level Parylene Packaging With Integrated RF Electronics for Wireless Retinal Prostheses," J. Microelectromech. Syst. 2010, pp. 735-742.

Marinov et al., "Laser-assisted ultrathin bare die packaging: a route to a new class of microelectronic devices," Proc. of SPIE, 2013, pp. 86080L-1 to 86080L-19.

Uddin et al., "Wafer Scale Integration of CMOS Chips for Biomedical Applications via Self-Aligned Masking," IEEE T. Compon. Pack. T., 2011, pp. 1996-2004.

Verplancke et al., "Thinned Dies in a Stretchable Package," ESTC, 2012.

International Search Report and Written Opinion for International Application No. PCT/US2014/071741, dated Mar. 20, 2015, 14 pages.

Examination Report for Australian Patent Application No. 2014368923, dated Jan. 4, 2018, 4 pages.

First Office Action for Chinese Patent Application No. 201480075961.7, dated Jul. 19, 2017, 14 pages.

Extended European Search Report for European Patent Application No. 14871982.6, dated Aug. 1, 2017, 11 pages.

Office Action for Japanese Patent Application No. 2016-541303, dated Sep. 11, 2018, 3 pages.

Second Office Action for Chinese Patent Application No. 201480075961.7, dated Aug. 15, 2018, 9 pages.

Third Office Action for Chinese Patent Application No. 201480075961.7, dated Apr. 24, 2019, 8 pages.

\* cited by examiner

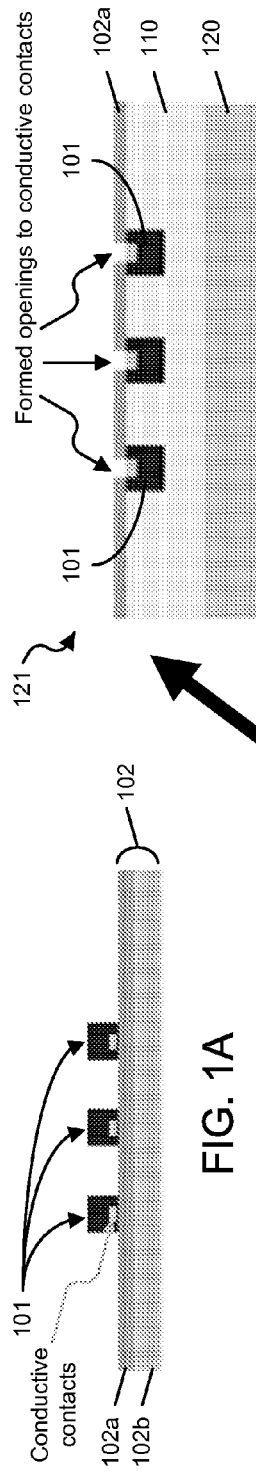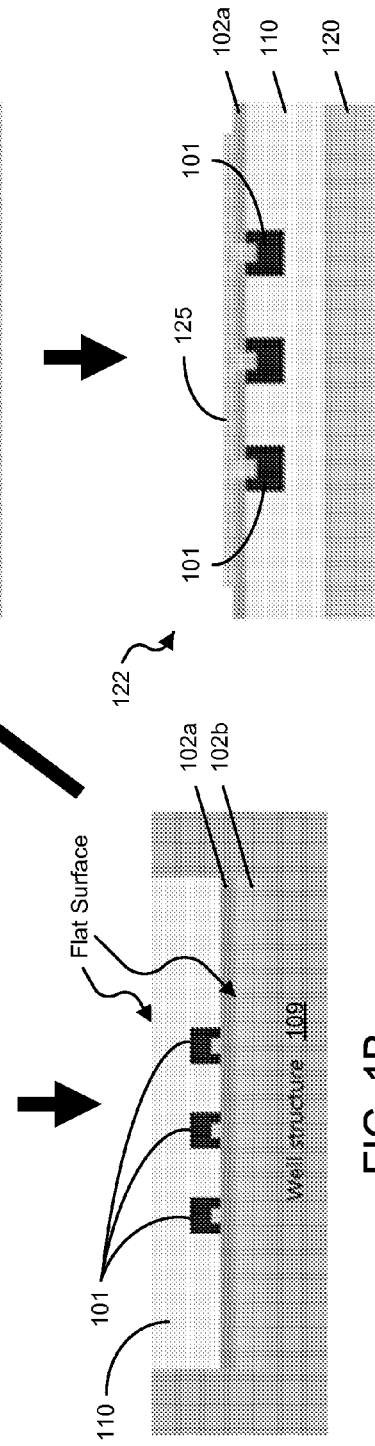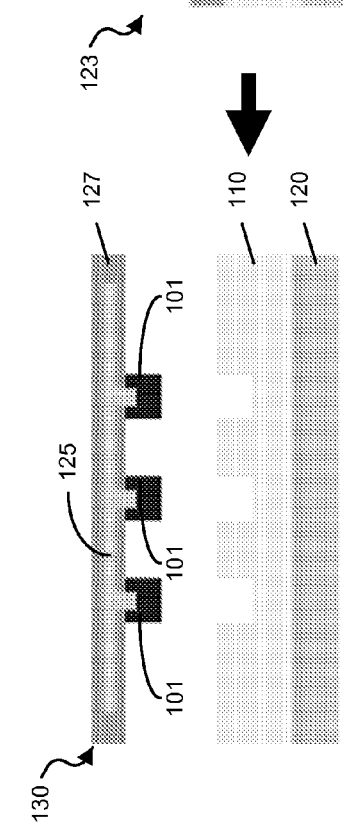

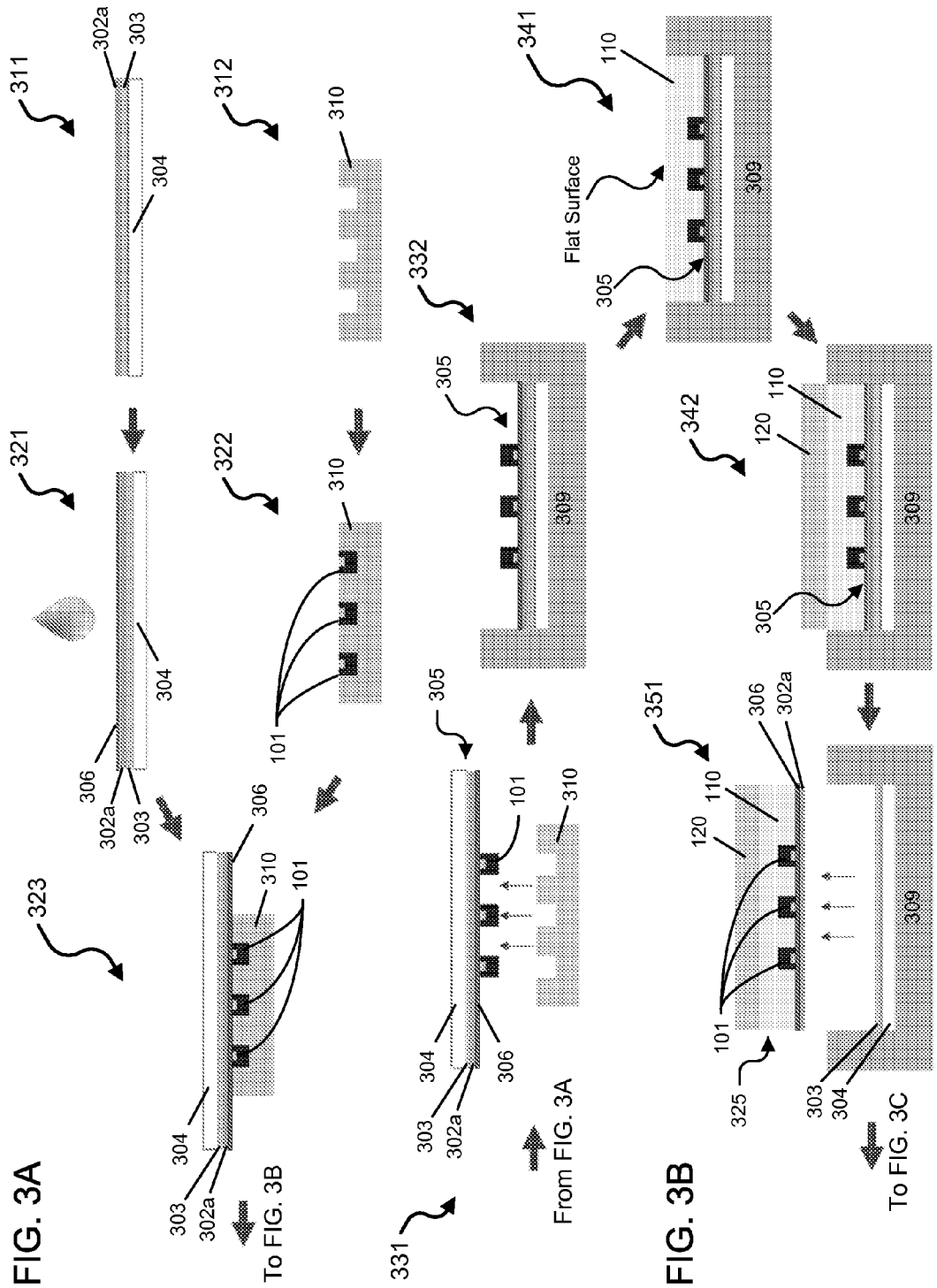

SCALABLE FABRICATION TECHNIQUES AND CIRCUIT PACKAGING DEVICES

CROSS REFERENCE TO RELATED APPLICATIONS

This application is a 35 USC § 371 National Stage application of International Application No. PCT/US2014/071741, entitled "SCALABLE FABRICATION TECHNIQUES AND CIRCUIT PACKAGING DEVICES," filed Dec. 19, 2014, which claims the benefit of priority of U.S. Provisional Patent Application No. 61/918,554, entitled "HIGHLY SCALABLE FABRICATION TECHNIQUES FOR FLEXIBLE ELECTRONIC CIRCUITS", filed on Dec. 19, 2013. The entire content of the aforementioned patent applications are incorporated by reference as part of the disclosure of this application.

TECHNICAL FIELD

This patent document relates to systems, devices, and processes in connection with electronic circuit fabrication.

BACKGROUND

Microfabrication processes include techniques for the production of materials, structures and devices on the micrometer scale and smaller. Microfabrication processes are typically used for integrated circuit (IC) fabrication, also referred to as semiconductor device fabrication. Semiconductor device fabrication processes are used to create devices having ICs that are present in everyday electrical and electronic devices. Typical semiconductor device fabrication involves a multiple-step sequence of photolithographic and chemical processing steps during which electronic circuits are gradually created on a wafer made of semiconducting material.

SUMMARY

Highly scalable and cost effective fabrication methods and packaging devices are disclosed for electronic circuits, devices, and systems, including flexible and/or stretchable electronics.

In one aspect, a method to fabricate a circuit or electronic device includes attaching an electronic component at a location on a substrate including a flexible and electrically insulative material, in which the substrate includes a flat surface opposite to that which the electronic component is attached; forming a template to encase the electronic component attached to the substrate by depositing a material in a phase to conform on the surfaces of the electronic component and the substrate, and causing the material to change to a solid form; and producing the circuit or electronic device by forming openings in the substrate to expose conductive portions of the electronic component, creating electrical interconnections coupled to at least some of the conductive portions in a particular arrangement on the substrate, and depositing a layer of an electrically insulative and flexible material over the electrical interconnections on the substrate to form a flexible base of the circuit, in which the produced circuit or electronic device is encased in the template.

In another aspect, an electronic device packaging includes a substrate including a flexible and electrically insulative material, the substrate structured to adhere one or more electronic components on a side of the substrate and to include openings spanning from the side into an interior region of the substrate, in which the openings are arranged to align to locations where conductive contacts of the one or more electronic components are designed to be positioned; and interconnection wires including an electrically conductive material, the interconnection wires disposed in the openings and the interior region of the substrate in a particular arrangement based on a device design to electrically connect the one or more electronic components, in which the substrate is structured to have a thickness less than 20 µm.

In another aspect, a method to fabricate a circuit or electronic device includes placing an electronic component in a cavity on a first side of a template, in which the cavity of the template is structured to have substantially the same geometry as the electronic component, and in which the placing encases the electronic component in the cavity such that conductive portions of the electronic component are exposed and the first side is flat; forming a substrate including a flexible and electrically insulative material on the first side of the template including the electronic component placed in the cavity to attach the electronic component to the substrate, in which the substrate includes a flat surface opposite to that which the electronic component is attached; and producing the circuit or electronic device by forming openings in the substrate to expose conductive portions of the electronic component, creating electrical interconnections coupled to at least some of the conductive portions in a particular arrangement on the substrate, and depositing a layer of an electrically insulative and flexible material over the electrical interconnections on the substrate to form a flexible base of the circuit, in which the produced circuit or electronic device is encased in the template.

In another aspect, a method to fabricate a circuit includes attaching electronic components at selected locations on a substrate including a flexible and electrically insulative material; forming a cast to encase the electronic components attached to the substrate by depositing a casting material in a fluidic form to conform on the surfaces of the electronic components and the substrate, and allowing the casting material to change from the fluidic form to solid form; forming a circuit by forming openings in the substrate to conductive portions of the electronic components, creating electrical interconnections between the conductive portions in a selected arrangement over the substrate, and depositing a layer of an electrically insulative and flexible material over the electrical interconnections and exposed substrate to form a flexible and insulative base of the circuit; and releasing the circuit from the cast.

The subject matter described in this patent document can be implemented in specific ways that provide one or more of the following features. For example, in some aspects, the disclosed fabrication methods can be implemented to integrate off-the-shelf commercially-available electronic components (e.g., including those on bare die chips or thin films) with flexible and stretchable electronics for rapid and scalable device development, e.g., such as for wearable electronic devices. For example, the fabricated flexible electronic circuits can be used for tattoo sensor patches. The disclosed fabrication methods are highly scalable and capable of fulfilling large quantity orders, e.g., such as in the tens of thousands or greater. The disclosed technology can be employed in developing tools and techniques for rapid testing and prototyping of flexible electronics. Also, for example, the disclosed technology can provide end-to-end rapid solutions for a variety of flexible electronics applications, e.g., including those where widths of ~200 microns in some "island" areas, and less than 10 microns elsewhere, suffices.

Those and other features are described in greater detail in the drawings, the description and the claims.

BRIEF DESCRIPTION OF THE DRAWINGS

FIGS. 1A-1D show illustrative diagrams of an exemplary method to fabricate a flexible electronic circuit and/or device.

FIGS. 3A-3C show illustrative diagrams of another exemplary fabrication method to produce electronic circuits and/or devices, including flexible electronics.

DETAILED DESCRIPTION

Figure 2:
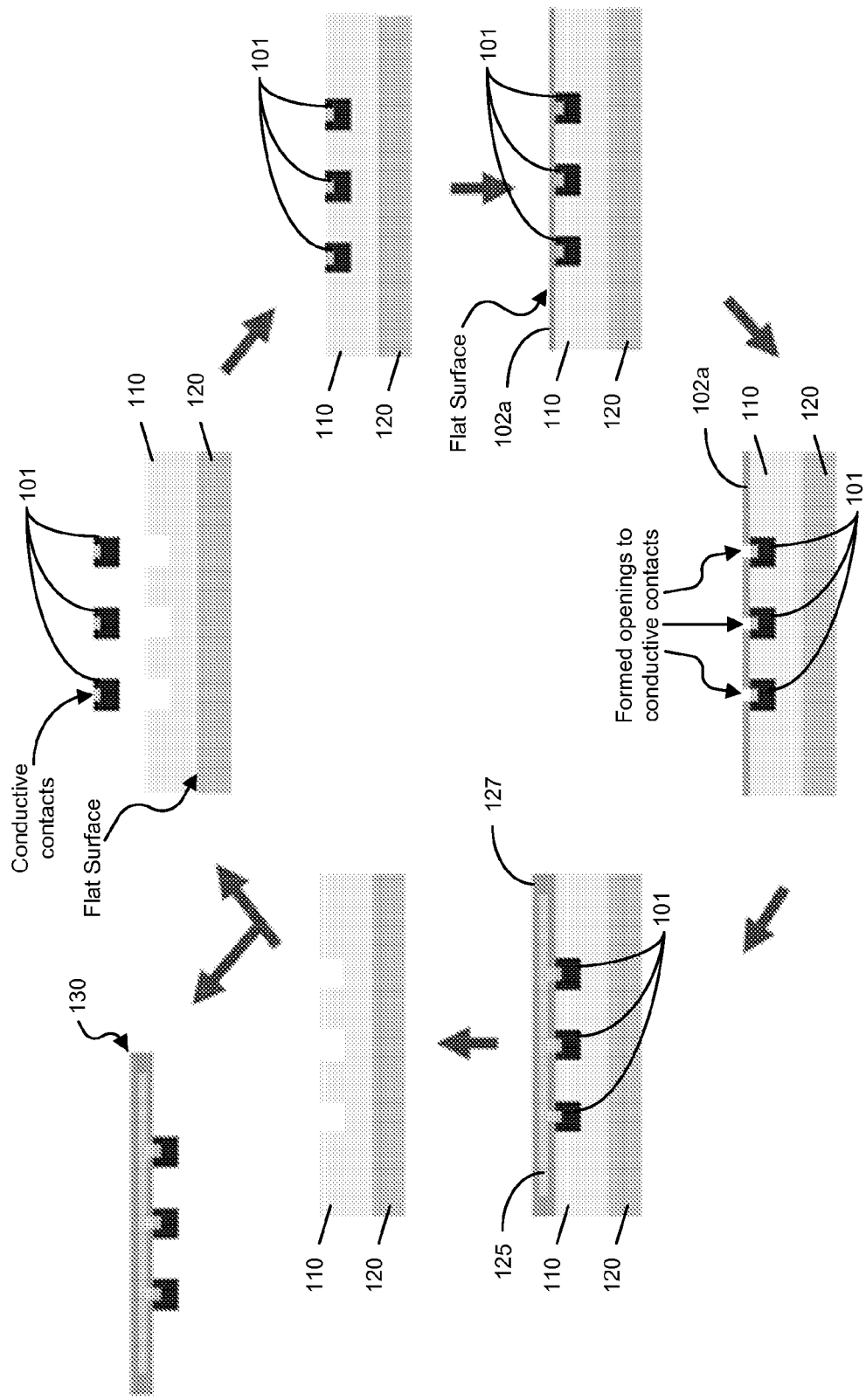
FIG. 2 shows a diagram of an exemplary process cycle for high volume production of flexible electronics by reusing the exemplary sacrificial cast as a mold in subsequent device fabrication processing.

Fabrication of electronic devices that include active and/or passive electrical components can be carried out in various ways. One example of existing fabrication approaches is to manually fabricate a relatively simple electronic device, e.g., one which may contain a small number of electronic components or parts. This approach may allow for lower cost and greater flexibility in managing design variations, but is significantly limited in its capability to fabricate complex device designs and is inefficiently time-consuming and non-scalable for device production. Another example of existing fabrication approaches is to invest in a foundry, which is capable to receive reliable, complex circuit designs to then process and form a working device from such designs. However, the foundry solution is expensive with respect to cost, inflexible with respect to design variations, and time-consuming for preparation of final designs before fabrication. Moreover, using the foundry solution, after a wafer is produced and dies are formed from the wafer, interfacing the die output is non-trivial.

Standard die interfacing generally takes one of two forms in various existing fabrication processes. In one form, standard die interfacing involves attaching the die component (i.e., the electronic circuit or microchip device fabricated on the die) directly to the circuit board typically through wire bonding, so that the die-based electronic component can be integrated with other electronics (e.g., such as other electronic circuits or devices). Wire bonding can be an expensive, cumbersome, and time-consuming intermediary process that bottlenecks the speed of device fabrication due to the specialized equipment required and particular parameters associated with the die output to interface to the board. In the case of flexible and stretchable electronics, wire bonding may be inadequate or inappropriate because it can leave many thin inflexible wire connections exposed, which can easily be broken if the device is flexed or stretched. To mitigate this problem, an encasing can be used to protect these connections, but the encasing considerably increases the thickness, footprint, and rigidity of the die-based microchip device in the applied area. In the other form, standard die interfacing includes packaging the component in a device package that is easier to handle and easier to connect to. Common packaging includes the Quad Flat No-leads (QFN) package, which the component is placed inside a plastic package and wire bonded to metal pads on one side of the package that can be connected to substrates, such as printed circuit boards (PCBs), through soldering or conductive epoxy. Device packages share many similar problems with device encasements, including increase in the thickness (e.g., since package is directly attached to the board), footprint, and rigidity of the microchip device on the board. For example, even in situations when the electronic device uses a flexible PCB (e.g., die-based electronic component is placed on a flexible PCB), flexion in proximity to the packaged or encased electronic device can cause the connections to fail. Additionally, flexible PCBs do not accommodate stretchability. Therefore, it is difficult to design components that are easy to interface, have sufficient functionality, and are small enough to integrate into flexible and stretchable electronics.

The disclosed technology in this patent document can be used to provide highly scalable and cost effective fabrication methods for producing electronic circuits, devices, and systems, e.g., including flexible and/or stretchable electronics. Also disclosed are packaging devices, which can be utilized in the highly scalable electronic circuit and device fabrication techniques of the present technology.

The disclosed electronic device fabrication technology can be used to integrate thin, small, and/or commercial-off-the-shelf electronic components (e.g., which may already be optimized by microchip manufacturers) with conventional microfabrication processes in a manner that is scalable for large-scale production, cost effective, and creates a smaller footprint of the fabricated electronics. The marriage of fabrication processing of flexible substrates and existing microfabrication techniques, using the disclosed technology, allows for fast prototyping, optimizations, and large-scale production of such flexible electronic circuits and devices while maintaining the overall device properties and functionalities, e.g., including stretchability and flexibility. For example, in implementations, the disclosed technology can ultimately provide the end solution in the fabrication process of the desired circuits, devices, and/or systems. The disclosed technology provides a unique approach to circuit fabrication that allows precise attachment of multiple electronic components on a device substrate, including on a flexible substrate, without requiring additional processing, e.g., such as die thinning, to accommodate conventional microfabrication technology. For example, die thinning processes can be not only cumbersome and costly, but thinned dies can also be more prone to crack and fail.

Using the disclosed technology, electronic circuits and devices can be produced by direct integration of the commercial, off-the-shelf electronic parts or components on a device substrate (e.g., including rigid or flexible and/or stretchable substrates) by creating a template structure by a mold or cast that arranges the electronic components in the designed layout and provides a uniform planar surface to form the device substrate embedding the interconnections between the electronic components based on the electronic circuit or device design. In some implementations of the disclosed methods, the template structure providing the planar surface is created by pouring uncured cast material (e.g., elastomeric material) onto a flat temporary substrate (e.g., including a flexible substrate) that includes model components or the actual electronic components of the electronic circuit or device design arranged in the desired layout on the temporary substrate, and curing the cast material (e.g., elastomeric material) to form a rigid and flat overall structure.

Exemplary microfabrication processes, e.g., such as metal deposition, reactive ion etching, and photolithography, can then be performed to make electrical contact openings, via holes, interconnects, and filamentary serpentine shapes. Moreover, for example, allowing the usage of microfabrication tools, e.g., such as a sputter deposition tool and mask aligner, means that highly precise interconnections can be made to the conductive contact regions (e.g., pads) of the electronic components (e.g., microchips, such as ICs on bare die) regardless of the pad's material, pitch, or shape. For example, this is advantageous over typical reflow soldering technique where pad material dictates how robust solder connection is as well as over anisotropic conductive adhesive technique where the pads need to have a bumped shape and maintain large pitch between pads.

The disclosed technology can be utilized for a variety of applications across multiple, varying industries and fields. In some aspects, the disclosed fabrication methods can be implemented to integrate off-the-shelf commercially-available components including integrated circuits (ICs), e.g., on bare die chips and thin films, with flexible and stretchable electronics for rapid and scalable device development, e.g., such as for wearable electronic devices. The described techniques are highly scalable and capable of fulfilling large quantity orders, e.g., such as in the tens of thousands or greater. The disclosed methods can be especially useful where the added size and bulk of sensing, processing, communication, and actuation devices may disrupt the natural state and performance of the system being recorded, e.g., which is often the case for many applications of physiological monitoring (e.g., such as sleep monitoring). The disclosed technology is also applicable to robotics or any system where electronic device size may disrupt movement of the system or add discomfort to a user.

In one aspect, a method to fabricate an electronic circuit or device includes a process of attaching one or more electronic components at selected locations on a substrate including a flexible and electrically insulative material. The method includes a process of forming a template to encase the electronic components attached to the substrate by depositing a casting or molding material in a form or phase to conform on the surfaces of the one or more electronic components and the substrate, in which the casting or molding material converts to a solid form. The method includes a process of constructing a circuit (or device) by forming openings in the substrate to selected conductive regions of the one or more electronic components, creating electrical interconnections between the selected conductive regions in an arrangement over the substrate (e.g., based on the design of the circuit or device), and depositing a layer of an electrically insulative and flexible material over the electrical interconnections and exposed substrate to form a flexible base of the circuit. In some implementations, the method can include releasing the circuit (or device) from the template. Moreover, the method can include a reusing the template in subsequent implementations of the method to fabricate additional electronic circuits/devices of the same design. In other implementations, the method can include a process retaining the produced circuit (or device) in the template, in which the template provides an inflexible encasement with a relatively insubstantial footprint (e.g., as compared to conventional device packages or fabricated devices) that can be integrated with another device or circuit, e.g., on a printed circuit board.

FIGS. 1A-1D show illustrative diagrams of an exemplary method to fabricate a flexible electronic circuit and/or device. FIG. 1A shows a diagram of a guided attachment process of the exemplary fabrication method to produce flexible electronics. As shown in the diagram, one or more electronic components 101 are attached at specific locations on a substrate 102 including at least a flexible substrate portion. In the example shown in FIG. 1A, the substrate 102 includes a flexible film 102a over a temporary substrate 102b, in which the temporary substrate 102b is a rigid substrate portion. For example, the flexible film 102a can include any material that can exhibit flexibility and stretchability, and can also withstand conventional cleanroom processes. Some examples include, but are not limited to, polyimide, silicone-base elastomers, benzocyclobutane (BCB), SU-8, or other elastomers containing additive conductive particles (e.g., carbon particles, carbon nanotubes, Si nanowires). For example, the temporary substrate 102b can include any material that can hold the flexible film, as well as can release it, e.g., including silicon or glass. The temporary substrate 102b includes a surface to receive the flexible film 102a that has a high smoothness and is flat. The electronic components 101 can include commercially available microchips (e.g., such as bare die, surface mount units, etc.) including processors, memory, converters, radio transmitters, etc.; integrated circuits including amplifiers (e.g., biopotential amplifiers, operational amplifiers, instrumentation amplifiers, power amplifiers, low-noise amplifiers, etc.), optocouplers, comparators, digital logic circuits, power converters, etc.; sensors/transducers including piezoelectrics, microphones, electrochemical sensors, accelerometers, gyroscopes, strain gauges, electrodes (e.g., biopotential electrodes), infrared sensors, ultrasound sensors, thermistors, speakers, ultrasound, antennas, heating elements/coils, etc.; electrical circuit components including resistors, capacitors, inductors, diodes, light-emitting diodes (LEDs), transistors, batteries, etc.; and Microelectromechanical Systems (MEMS) technology.

For example, in some implementations of the guided attachment process, multiple off-the-shelf microchip components of variable shapes and dimensions can be attached onto the surface of the substrate 102 while maintaining predetermined distances among chips. The electronic components 101 can be guided to the specific locations such that they are arranged to have specific orientations, alignments, and distances between them. Placement of the electronic components 101 (e.g., microchips) can be performed manually or by automated tools, e.g., including industry standard pick-and-place tools (e.g., providing high accuracy and high throughput). In the example shown in FIG. 1A, the exemplary chips are oriented such that the conductive (e.g., metal) contact pads directly face the flexible film. In other examples, the exemplary chips can be configured in orientations in which their contact pads are disposed on a side periphery or other surface not in contact with the flexible film.

In some implementations of the guided attachment process, for example, the flexible film 102a (e.g., a polyimide film) can be laid down on the temporary substrate 102b, and then the electronic components 101 can be selectively deposited, e.g., through guided deposition and/or attachment techniques. In other implementations, this process may be reversed. For example, the electronic components 101 may first be placed on the temporary substrate 102b, e.g., without making permanent attachment, then a layer of flexible/ stretchable film can be casted over the temporary substrate 102b and the electronic components 101.

FIG. 1B shows a diagram of a template formation process of the exemplary fabrication method to produce flexible electronics. As shown in the diagram, after the electronic components 101 are attached to the substrate 102, a casting or molding material is formed over the film and chips, which forms a template structure 110 that encases the arranged electronic components 101 attached to the substrate 102, and is added until at least the thickest chip component is submerged by the casting or molding material. The casting or molding material can include a material in a phase that can conform to the surfaces of the exemplary flexible film with attached components, but can firmly encase the exemplary flexible film with attached components for further processing without compromising the functionality of the to-be-fabricated device. For example, the casting or molding material can include an elastomer, such that when the elastomer is in liquid-like form, it conforms or 'hugs' over the electronic components and accommodates any type of geometry of the various electronic components 101; but when the elastomer is in solid form, it becomes solidified to serve as a design template to facilitate component arrangement, connection, and release, i.e., the template structure 110. In the exemplary case of using PDMS as the casting or molding material, the change in its characteristic (e.g., liquid→solid) provides a key property and benefit. The template formation process can include applying a cast- or mold-forming structure having a flat surface to the uncured or liquid form casting or molding material to form a flat surface. As shown in the diagram of FIG. 1B, there are at least two flat surfaces among the combined template structure 110 and the encased electronic components 101 attached to the substrate 102, which include the outward side of the template structure 110 that is opposite to the side attached to the substrate 102, and the outer side of the flexible portion of the substrate 102 (e.g., flexible film 102a, which is shown attached to the temporary substrate 102b). For example, these flat surfaces are important for microfabrication, e.g., maintaining of which is directly related to the yield and quality issues. In some implementations, for example, the two parallel flat surfaces, as depicted in FIG. 1B, can be formed as follows. In one example, small particles (e.g., sand-like particles) may be packed inside the well to serve the same function.

In some implementations of the template formation process, for example, the formed structure from the guided attachment process, i.e., the attached electronic components 101 to the substrate 102, can be placed inside an well structure 109 prior to depositing the casting or molding material in the liquid or fluidic form that conforms on the surfaces of the electronic components 101 and the substrate 102. For example, a sacrificial material or casting material, which exhibits liquid-like characteristic during molding stage but that exhibits solid-like characteristic during fabrication stage, is poured over the exemplary chip+film substrate secured in the well structure 109. Subsequently, for example, the cast- or mold-forming structure can be applied to the casting or molding material by aligning with the well structure 109 to maintain the flatness of the casting or molding material on the outward side as it hardens. In some implementations of the exemplary fabrication method, for example, the well structure 109 can be configured to have a flat surface and to receive the flexible film 102a (e.g., without the temporary substrate 102b) prior to the guided attachment process to facilitate the attachment of the electrode components 101 to the substrate 102 while the substrate 102 is inside an well structure 109.

Some exemplary properties for the casting or molding material can include the ability to flow and 'hug' the exemplary electronic components that may have various shapes and geometries, the ability to become rigid (e.g., curing), and the ability to release from the completed device. Examples of suitable casting or molding materials include a variation of silicone elastomers (e.g., PDMS, Ecoflex, and Solaris) that meet all these criteria. Exemplary implementations of the disclosed methods using Solaris have provided good quality template structures 110.

Once the template structure 110 is formed (e.g., casting or molding material is solidified), the template structure 110 encasing the electronic components 101 attached to the flexible film 102a (the flexible substrate 102) can be detached from the temporary substrate 102b to enter microfabrication processing. In some implementations, the rigid substrate or base 120 can be attached to the flat surface of the template structure 110 to aid in microfabrication processing and/or as a reinforcement. For example, the rigid base can include a material that is rigid, flat, and resistant to heat and/or chemicals to be used in microfabrication, e.g., such as silicon or glass. For example, the rigid base 120 can prevent "bowing" of the elastomer material during high temperature processes and maintains the flatness of the overall device, in such examples. It can also provide the ease of handling during microfabrication processing steps.

FIG. 1C shows a diagram of a microfabrication processing to produce the designed circuit or device, e.g., including flexible electronics. During the microfabrication processing stage, microfabrication techniques to expose or form openings to conductive portions or contacts of the electronic components 110, to form conductive connections (e.g., interconnections, vias) to selected conductive contact sites, e.g., based on the circuit or device design, and to form the circuit or device base or substrate (e.g., including a dielectric and/or electrically insulative material) can be implemented. For example, standard microfabrication process such as dry etching (e.g., process 121), metal deposition (e.g., process 122), and spin coating (e.g., process 123) can be conducted on the electronic components 101 attached to the flexible film 102a and encased in the template structure 110, as the flat surfaces of this overall structure are maintained. For example, being able to employ standard microfabrication processes for flexible electronics using the disclosed fabrication techniques is far more advanced approach that any other types of techniques for integrating chip components on a flexible film, e.g., because the disclosed fabrication techniques provide the ability to form highly precise and dense interconnects. For example, the nature of high precision and density can be achieved by photolithography, a standard semiconductor processing technique that can be used to define micro-scale features on substrates.

For example, given the planar nature of the flexible film and the disclosed processes of the exemplary fabrication method in FIGS. 1A-1D to provide a platform to perform subsequent circuit fabrication steps, conventional microfabrication techniques such as spin coating, photolithography, thin-film deposition, and/or dry/wet etching can be performed on the produced platform including the electronic components 101 attached to the flexible film 102a and encased in the template structure 110.

Referring to the embodiment shown in FIG. 1C, the fabrication method can include a process 121 to form openings in the substrate 102 to interfacing or conductive portions of the electronic components 101. The fabrication method can include a process 122 to create electrical interconnections 125 between the conductive portions in a selected arrangement over the substrate 102. The fabrication method can include a process 123 to deposit a layer of a flexible and electrically insulative and/or dielectric material over the electrical interconnections and exposed substrate 102 to form a flexible base 127 of the produced electronic circuit or device. For example, the formed electrical interconnections 125 that connect the arranged electronic components 101 based on the circuit or device design, and the flexible base 127 that encompasses and protects the interconnections and is a substrate to the electronic components 101, can provide a packaging of the produced electronic circuit or device. The produced electronic circuit or device can be encased in the template structure 110 for a desired amount of time, e.g., prior to releasing the circuit or device.

In some examples, for the process 121, photolithography can be used, e.g., providing highly precise connection to conductive sites or pads of the attached microchips, even for bare dies that have small spatial separation between pads. Also, for example, for the process 122, sputter deposition, or electron beam deposition, of a metal layer is highly advantageous over other methods of making connection to chips' pads, e.g., such other methods including using the anisotropic conductive paste (ACP) or solder material. ACP suffers from lateral shorting if two pads are too close to each other. Also ACP is not appropriate if the contact pads do not form protrusion, which is common in most bare die packaging. Soldering is inappropriate for the use with bare dies because solder material do not wet aluminum, which is a common metal for bare dies' pads. However, sputtered, or electron beam evaporated, metal layer adheres to most bare die contact pads, and its ability for use in the disclosed method illustrates one of the many benefits provided by the disclosed technology. Also, for example, for the process 123, an insulating layer (e.g., of a polymeric material) and/or a dielectric layer can be formed to produce the flexible base 127. For example, the flexible base 127 can include polyimide, SU-8, BCB, epoxy, or materials used to produce the flexible film 102a. For example, the flexible base 127 can be formed using the same material selected for the flexible film 102a. Yet, in some implementations, the flexible base 127 may include different materials that allow for specific dielectric constants in certain areas of the base 127, e.g., for radio frequency applications or for forming capacitors in the circuit or device packaging, e.g., the interconnections 125 and base structure 127 of the completed circuit or device 130.

In some implementations, the processes 121-123 can include forming contact pads for the to-be-fabricated circuit or device, e.g., such as at outer regions of the flexible base 127, to allow for the fabricated circuit or device to electrically interface with other devices in a system or apparatus.

FIG. 1D shows a diagram of a releasing process of the exemplary method to remove the fabricated flexible electronic circuit or device 130 from the template structure 110. For example, in some implementations of the releasing process, the completed device 130 can be peeled off of the template structure 110 (e.g., sacrificial cast) and be attached to a subsequent substrate or to function as a free-standing device. This exemplary step demonstrates that the casting or molding material needs to be able to release the completed device, unless the completed device 130 is acceptable to operate within the template structure 110.

For example, in the exemplary case of using an elastomer as the casting or molding material, an adhesive layer with higher surface energy than the casting or molding material can be applied to the outer surface of the flexible base 127 to be used to remove the completed device 130 from the template structure 110, e.g., to allow for peeling the completed device 130 off the template structure 110. If the cast material's surface energy can be modified by means of additional processes, e.g., submerging in a solution, heating, and radiative energy transfer, the device may be released to form free-standing device. In some implementations, the top layer of the completed device 130 can be coated with an adhesive layer to aid the transfer to a target substrate. For example, this type of packaging scheme provides the extremely wide range of use cases where quick attachment of one or more flexible, stretchable electronic devices onto a surface of interest is desired.

The exemplary fabrication method allows for reuse of the produced template structure 110 for repeated fabrication to produce large quantities of the flexible electronic circuit or device 130. In one example for a high volume production of flexible electronics, the template structure 110 can be reused to produce multiple flexible electronic circuits or devices. Similarly, for example, the template structure 110 can be made to facilitate multiple quantities of the flexible electronic circuit or device to be fabricated on a single template structure.

FIG. 2 shows a diagram of an exemplary process cycle for high volume production of flexible electronics by reusing the template structure 110 in subsequent device fabrication processing. The exemplary method illustrated in FIG. 2 can include some of the exemplary processes described in FIGS. 1A-1D, which may include modification to such processes, to re-use the produced template structure 110, e.g., as a mold, cast or template, for subsequent circuit or device fabrication processing. For example, the fabrication method of FIG. 2 can include first producing the template structure 110 for a given circuit or device design including one or more electronic components (e.g., such as a set of microchip components for a circuit). A method to produce a template structure 110 can include the guided attachment process shown in FIG. 1A and the template formation process shown in FIG. 1B, in which the template structure 110 can be separated from the attached electronic components 101-substrate 102 structure produced by the guided attachment process. In some implementations, e.g., model or dummy components can be utilized (e.g., substitute for the electronic components) to produce the template structure 110, in which the model or dummy components have the same geometry as the electronic components 101 to be used in the circuit or device design to be mass-produced. The produce template structure 110 includes at least one flat surface on the opposite side of the template structure 110 to that with the trenches or wells that receive the electronic components. The flat surface allows the template structure 110 containing electronic components 101 to be compatible with industry standard microfabrication equipment, e.g., such as mask aligner, spin coater, reactive ion etcher, and chemical vapor deposition tool, all of which are designed for processing of flat silicon wafers.

The template structure production method can be repeated as desired to make multiple template structures. Once the template structures are created, an automated component guiding and attachment tool such as the exemplary pick-and-place tool can be used to insert the electronic components (e.g., IC chips) into their respective wells or trenches in the exemplary template. After the chips are placed in the template, the flexible layer can be formed (e.g., either by spin coating or by simply attaching a film, among other techniques) on top of the mold and chips. Once the flexible layer has formed, microfabrication techniques can be performed to generate the circuit or device as designed. For example, implementation of the disclosed production method can significantly reduce the cost (e.g., by creating a reusable template) and increase production speed. As shown in FIG. 2, the produced template structure 110 can receive the one or more electronic components 101 selected based on the electronic circuit or device design in the patterned wells and/or trenches. In some implementations, the produced template structure 110 can be attached to the rigid base 120. The flexible substrate 102a is formed over the template structure 110 to attach to the electronic components 101. As shown in FIG. 2, the flexible substrate 102a is formed to have a flat surface on its outward facing side. Openings are formed through the flexible substrate 102a to the selected conductive features of the electronic components 101. The electrical interconnections 125 can then be created to electrically connect the selected conductive portions in a predetermined arrangement over the deposited flexible substrate 102a. The flexible base 127 is formed, e.g., by depositing an electrically insulative and flexible material over the electrical interconnections, to produce the electronic circuit or device 130. The produced electronic circuit or device is released from the template structure 110, and the template structure 110 can be reused to repeat the exemplary device fabrication method.

Figure 3C:
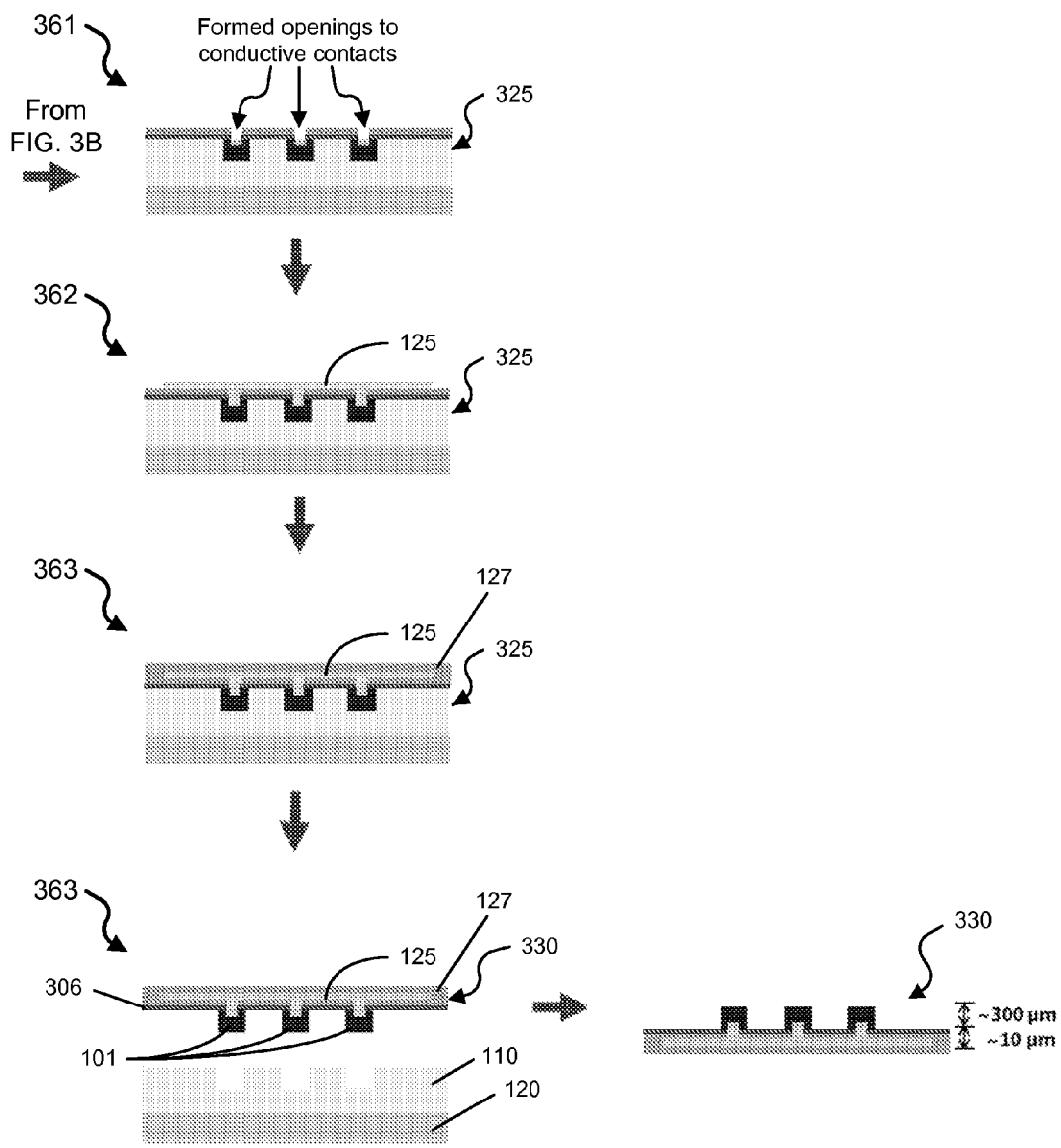

FIGS. 3A-3C show illustrative diagrams of another exemplary embodiment of the disclosed highly scalable fabrication methods to produce electronic circuits and/or devices, e.g., including flexible electronics. As shown in FIG. 3A, the method includes a process 311 to form a flexible substrate 302. In the process 311, a flexible layer 302a is attached to an exemplary rubbery layer 303 (e.g., such as PDMS) formed over or attached to a rigid base 304, such as a glass slide. In some implementations of the process 311, for example, a thin flexible polymer layer, e.g., such as a 7 μm thin Kapton film, can be laminated onto the PDMS on the glass base. The method includes a process 312, which can be performed before, after, or concurrent to the process 311, to produce a rigid template structure 310 that can be used to arrange and place electronic components 301 on the flexible substrate 302. In some examples, the rigid template structure 310 can include silicon (Si), in which wells or trenches are etched into the Si in specific locations, e.g., in which the wells and/or trenches are configured to a depth and geometry to hold the electronic components 301 (e.g., such as bare die microchips, thin film circuits or chips, or other active or passive electronic components including diodes, LEDs, impedance elements, etc.). The method includes a process 321 to coat an adhesive layer 306 on the flexible substrate 302 capable of attaching the electronic components 301 in a subsequent process. The method includes a process 322, which can be performed before, after, or concurrent to the process 311 and/or 321, to place the electronic components 301 into the formed wells and/or trenches of the rigid substrate 310. In the example shown here, the deposition of the circuit components is made with contact pads facing up. In other exemplary implementations, for example, the deposition process can include depositing circuit components having other configurations of the contact pads including along the sides of the components. The method includes a process 323 to attach the two substrates 302 and 310, in which the electronic components 301 are brought into contact with the adhesive layer 306 on the flexible substrate 302 to allow for component transfer.

As shown in FIG. 3B, the method includes a process 331 to release an attached component-substrate formation 305, which includes the electronic components 301 attached to the flexible substrate 302 (the flexible film 302a via the adhesive layer 306), from the rigid template structure 310. For example, the rigid template structure 310 can be reused in the process 322 to place the electronic components 301 into the formed wells and/or trenches of the rigid substrate 310. The method includes a process 332 to place the attached component-substrate formation 305 in an exemplary well structure 309. In some implementations of the process 332, for example, insulation for the electronics can be performed, e.g., such as deposition of Parylene C. The method includes a process 341 to produce the circuit and/or device template structure 110. In some implementations, the process 341 includes pouring a casting or molding material (e.g., elastomeric material) into the well structure 309, e.g., to a level that fills up the cavity of the well structure 309. The casting or molding material is poured in a liquid-like phase to conform to the surfaces of the attached components and flexible substrate. The process 341 includes facilitating the hardening or solidification of the casting or molding material to form the template structure 110. Implementations of the process 341 includes creating a flat surface on the outward facing surface of the template structure 110. The template structure 110 then firmly encases the attached component-substrate formation 305 for further processing without compromising the functionality of the to-be-fabricated device. In some implementations of the process 341, for example, the casting or molding material can include PDMS. In some implementations of the method, the method can include a process 342 to attach a base 120, e.g., such as a silicon wafer, to the template structure 110, which can ease handling during subsequent microfabrication processes. The method includes a process 351 to separate the component-substrate-template formation 325 that is used to create the finalized circuit or device, which includes the electronic components 301 attached to the flexible substrate 302 (the flexible layer 302a via the adhesive layer 306) encased in the template structure 110, from the well structure 309 and temporary substrate portions at the interface between the flexible layer 302a and the rubbery layer 303.

The method includes performing microfabrication processes using the component-substrate-template formation 325, e.g., such as the processes 361, 362, and 363 shown in FIG. 3C, to form the circuit or device. In some implementations, the microfabrication processes can include a process 361 to produce openings to access to selected conductive regions on the electronic components 101 through the flexible substrate 302n some implementations, the microfabrication processes can include a process 362, to form to electrical connections 125 (e.g., interconnects, vias) to the conductive portions through the formed openings, e.g., which can include using sputter deposition techniques of Ti/Au. In implementations of the process 362, for example, extra layers of interconnections can be added, e.g., if needed, to provide electrical connections that may be used to interface with other or additional circuits or devices. In some implementations, the microfabrication processes can include a process 363 to form the flexible base 127 of the electronic circuit or device, e.g., by depositing a layer of an electrically insulative and/or dielectric material that can be flexible and/or stretchable (e.g., such as polyimide) over the electrical interconnections and exposed substrate 102. The method includes a process 363 to remove the produced electronic circuit or device 330 from the template structure 110, e.g., which can be peeled off from the exemplary elastomer cast. FIG. 3C shows an example illustrative schematic of the completed device 330 fabricated using the exemplary method to include a flexible substrate height of around 10 µm, and a height of the electronic components in the hundreds of microns (e.g., approximately 300 µm in this example).

FIGS. 4A-4D show illustrative diagrams of another exemplary embodiment of the disclosed highly scalable fabrication methods to produce electronic circuits and/or devices, e.g., including flexible electronics and non-flexible electronics with reduced footprint.

Figure 4A:
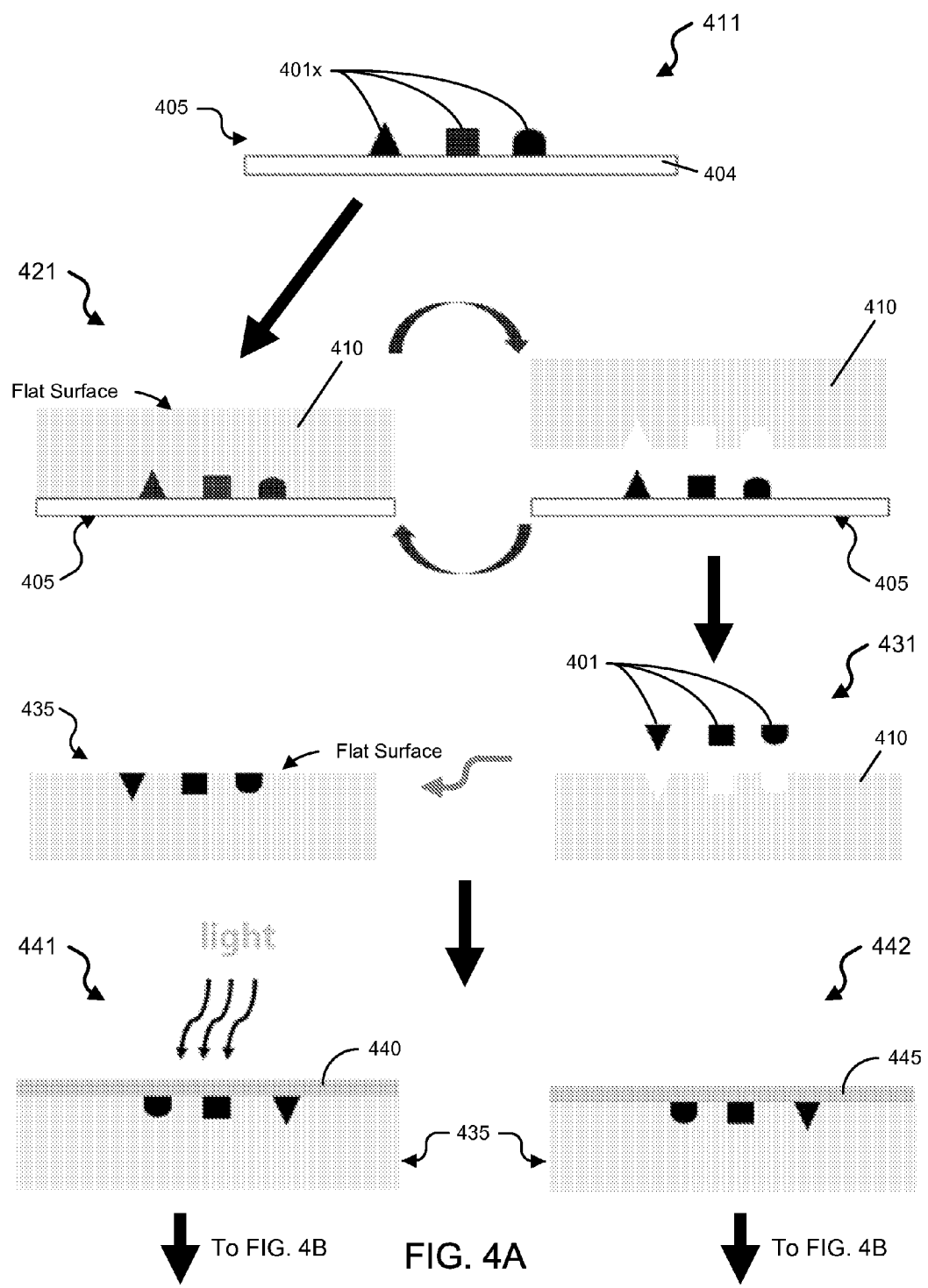
FIGS. 4A-4D show illustrative diagrams of another exemplary fabrication method to produce electronic circuits and/or devices, including flexible electronics and non-flexible electronics with reduced footprint.

As shown in FIG. 4A, the method includes a process 411 to produce a mold master structure 405. The mold master structure 405 can be produced using model or 'dummy' electronic components 401x that resemble the bare die, surface mount, thin film circuits or chips, diodes, LEDs, impedance elements, etc., e.g., with respect to their geometry or other parameters. The model electronic components 401x are fixed to a rigid base or substrate, e.g., such as a glass slide. The model electronic components 401x are attached to the base 404 such that the x-y coordinates of the components 401x match exactly those of the electronic components to be used in the completed circuit or device. In some implementations of the process 411, the actual functional electronic components can be used as model electronic components 401x, in which the shape of the wells or trenches to be formed in the template mold will have the perfect "fit" for the same kind of components to be inserted.

As shown in FIG. 4A, the method includes a process 421 to produce a template structure 410 by depositing a casting or molding material (e.g., such as PDMS) in a liquid or fluidic form to conform on the surfaces of the model electronic components 401x and the base 404, and by solidifying (e.g., curing) the deposited casting or molding material from the fluidic form to solid form, e.g., by passively allowing the material to solidify or actively applying heat or other factor to solidify. The template structure 410 is formed over the base 404 containing the model electronic components 401x such that it conforms to the external surfaces of such structures. The template structure 410 is structured to include a flat surface on the side opposite to the side containing the cavities to hold the electronic components. Similarly, the process 421 can include other techniques to conform the casting or molding materials to the model electronic components 401x and the base 404, such that the template structure 410 is capable of being separated at the end of fabrication processes. In other implementations of the process 421, the template mold does not have to physically interact with the model electronic components 401x to have the one-to-one match. For example, in some implementations of the process 421, a bottom-up process such as 3D printing can be used to fabricate the template structure 410. The mold master structure 405 produced in the process 411 can be reused multiple times to create template structures over and over.

As shown in FIG. 4A, the method includes a process 431 to place electronic components 401 of the device-to-be-fabricated, e.g., including bare die, surface mount, thin film circuits or chips, diodes, LEDs, and/or impedance elements, etc., into the formed wells and/or trenches of the template structure 410. Based on the selection of the model electronic components 401x in the process 411 and the template formation in the process 421, the electronic components 410 have the exact shape as their counterpart wells/trenches, in which they are inserted. In the process 431, the electronic components 401 are inserted, and the resulting surface of the template structure-components formation 435 is configured to be flat, and the gaps between the components and the template structure are minimized. The template structure-components formation 435 is configured to be flush and flat to allow for microfabrication process to be performed on the surface, e.g., since having non-flat surface and/or voids may lead to defects in microfabrication processing.

As shown in FIG. 4A, the method includes a process 441 to deposit a light-sensitive curable material to form a thin, uniform layer on the working surface. In some examples, the light-sensitive curable material can include optically-sensitive polymers, e.g., such as Norland Optical Adhesives (e.g., NOA 61) by Norland Products. The layer of the optically-sensitive material layer 440 can be applied by spin casting the light-sensitive curable material over the flat surface of the template structure-components formation 435, covering the open surface of the encased electronic components 401 and portions of the template structure. The process 441 includes applying a light source at a particular wavelength or range of wavelengths to cause the applied light-sensitive layer 440 to cure from fluidic form to solid form. In some examples, the light source can be implemented to direct light of 320-380 nm wavelength (e.g., ultraviolet) at the light-sensitive curable material such as the NOA 61. The process 441 is advantageous because the it can be implemented at room temperature, and any of the electronic components that may be sensitive to high temperature are not affected. Moreover, the optical curing process may take only a few minutes. The process 441 forms a substrate attached to the electronic components 401.

In some implementations, the method can include a process 442 to deposit a thermally-curable material, e.g., such as a polymer including polyimide, to form a layer 445 over the working surface of the template structure-components formation 435. Subsequently, the process 442 includes applying heat to the coated template structure-components formation 435, e.g., which can include placing the coated formation in a high temperature oven (or on a hot plate) over a certain period of time (e.g., 1 hour at 250° C.) to cure the polymer. Implementation of the process 442 forms a substrate attached to the electronic components 401.

Figure 4B:
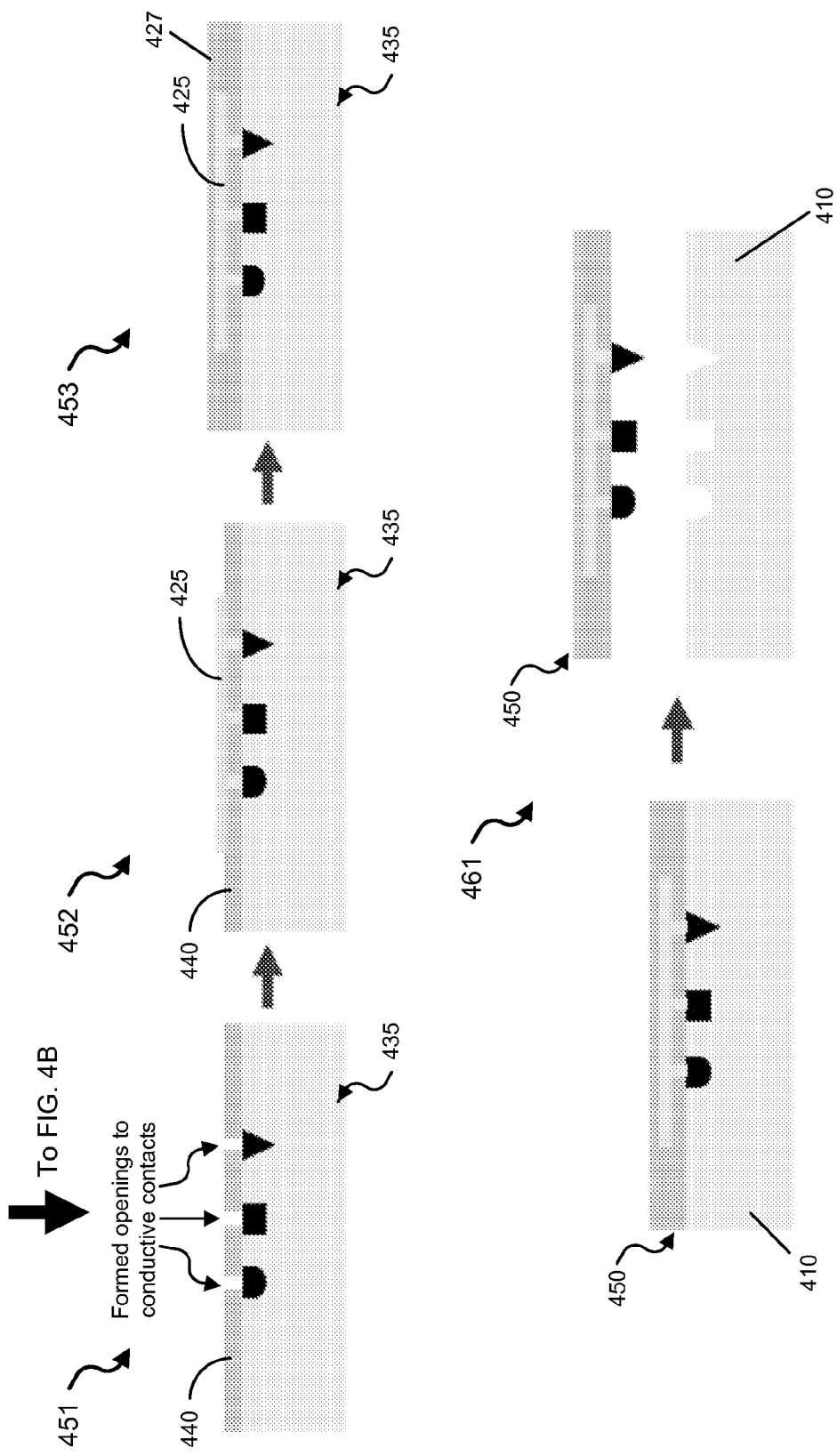

As shown in FIG. 4B, the method includes performing microfabrication processes using the template structure-components formation 435 with the formed substrate 440 to produce the circuit or device 450. For example, the method can include a process 451 to etch via holes to expose conductive regions of the embedded and coated electronic components 401 where subsequent metal interconnects will be microfabricated to make contact to. For example, the method can include a process 452 to sputter deposit patterned metal layers (e.g., using Ti/Au) to form the interconnections 425 between the electronic components 401 of the circuit or device 450. For example, structures formed by the process 452 such as parts of these interconnects themselves can be designed to have functions of passive electronic components, e.g., such as resistors, capacitors, and inductors, and/or active electronic components such as radio frequency components, e.g., such as antennas and transmission lines. The impedance of such components is tightly controlled by the geometry of the interconnects deposition process 452. This exemplary approach can eliminate the use of at least some of the electronic components 401 (or in some designs, all of the electronic components 401) of a given circuit or device, or including electronic components used on a PCB board to which the circuit or device 450 may be attached, and thereby result in further reducing cost while increasing yield. For example, the method can include a process 453 to add an insulating base layer to produce the substrate 427 of the device or circuit 450. In some implementations of the microfabrication processes, additional metal layers and/or polymer layers can be added to produce circuits that include interconnections and/or additional circuit elements arranged in between, around, in a different plane to the electronic components 401, and/or to produce a total encapsulation of the device or circuit 450.

Figure 4C:
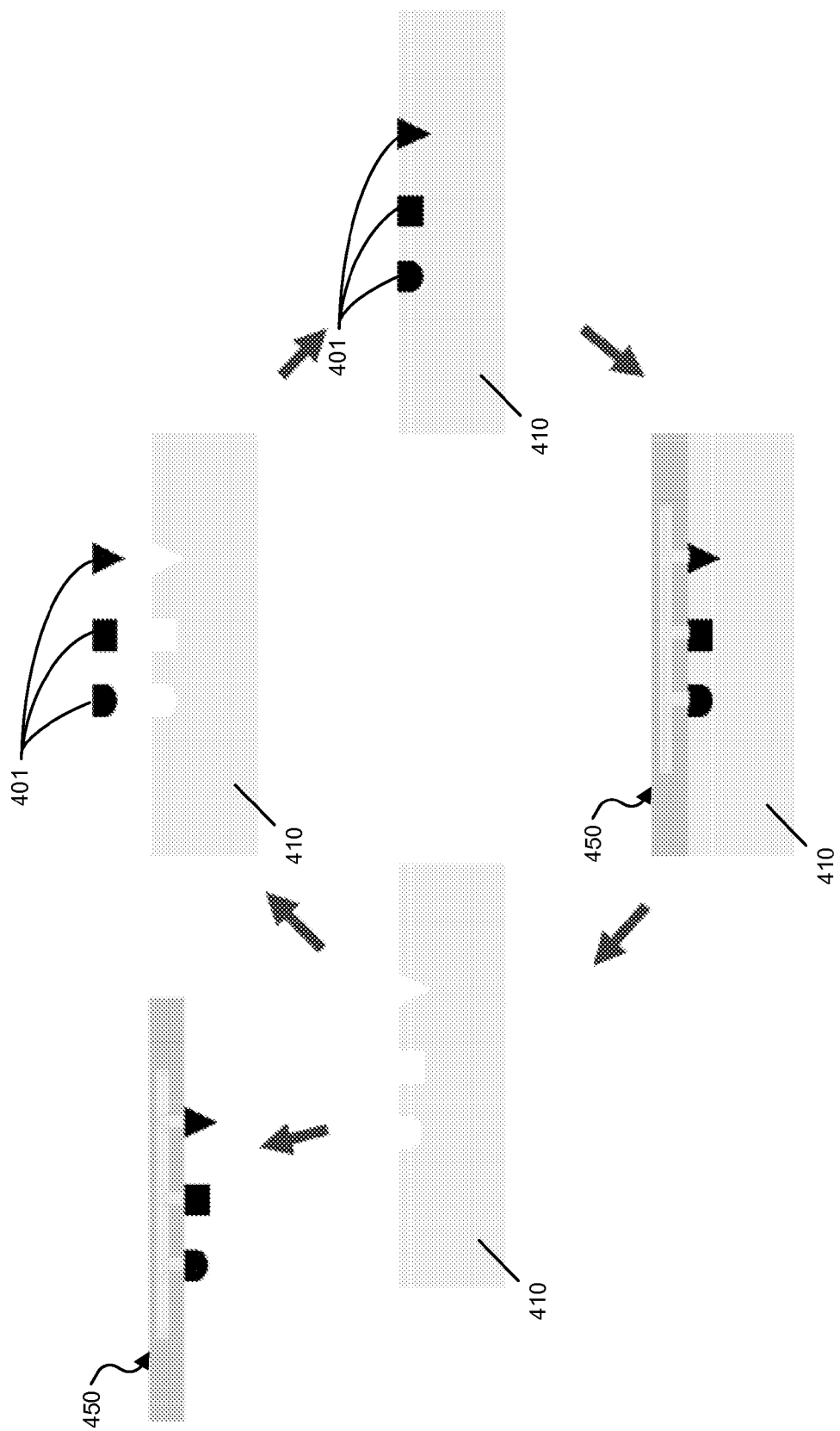
Figure 4D:
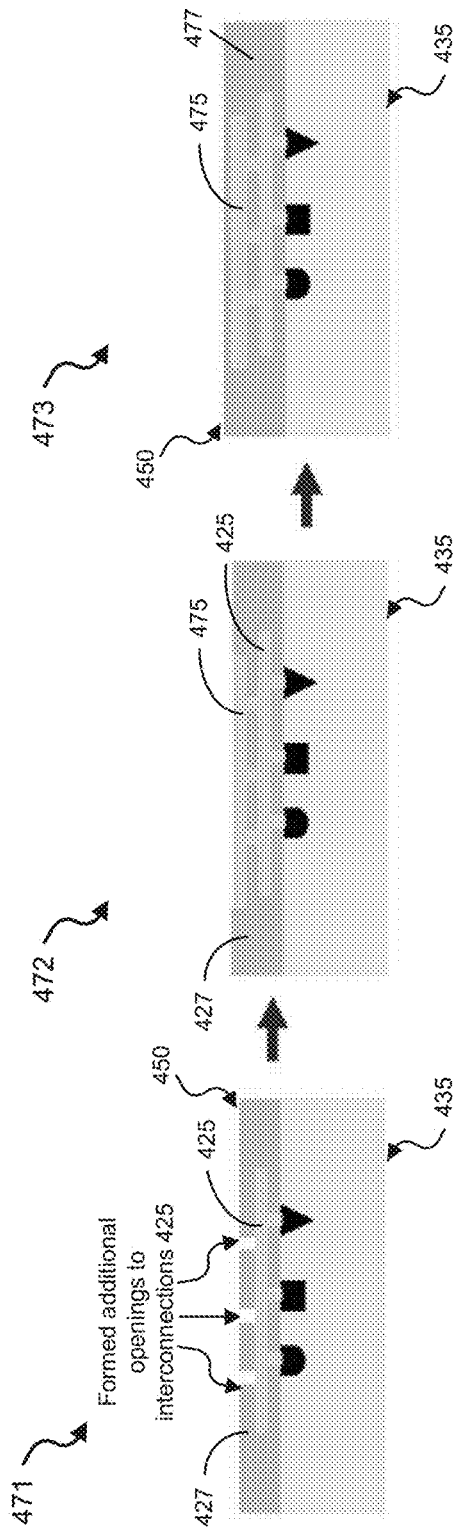

FIG. 4D shows additional microfabrication processes that can be performed using the template structure-components formation 435 to fabricate additional circuit elements in the device packaging (e.g., interconnects 425 and base 427) to produce the circuit or device 450. For example, the method can include a process 471 to etch via holes to expose portions of the interconnects 425 where additional circuit elements and/or metal interconnects will be microfabricated to make contact to. For example, the method can include a process 472 to deposit patterned metal layers or structures to form additional circuit elements and/or interconnections 475 in contact with the interconnections and/or elements 425 of the circuit or device 450. For example, the elements or structures formed by the process 452 such as parts of these interconnects themselves can be designed to have functions of passive electronic components, e.g., such as resistors, capacitors, and inductors, and/or active electronic components such as radio frequency components, e.g., such as antennas and transmission lines. For example, the impedance of such components is tightly controlled by the geometry of the interconnects deposition process 452. This exemplary approach can eliminate the use of at least some of the electronic components (or in some designs, all of the electronic components) of a given circuit or device, including components used on a PCB board to which the circuit or device 450 may be attached, and thereby result in further reducing cost while increasing yield. For example, the method can include a process 473 to add an insulating base layer to produce the substrate 477 of the device or circuit 450.

Referring to FIG. 4B, the method includes a process 461 to release the fabricated circuit or device 450 (e.g., by peeling off) from the template structure 410. The template structure 410 can be reused to repeat the exemplary device fabrication method, as depicted in FIG. 4C.

Alternatively, for example, the circuit or device 450 can be left adhered to the template structure 410 when the application does not require flexibility of the device. For example, in some applications, the configuration of the fabricated circuit or device 450 retained within the template structure 410 may be more practical, e.g., such as for the case of PCB manufacturing industry where smaller and smaller packaging is desired. Bare die components are not PCB-friendly and require additional packaging which makes them compatible with standard PCBs. The disclosed methods provide an essential way to integrate bare die components directly with PCB-like platform.

QFN is a typical surface mount package used to integrate conventionally fabricated electronic device or circuit on PCBs. QFN requires substantial area, costing valuable real estate on the PCB, in addition to cost and time for processing the electronic device with the QFN. Other conventional packaging techniques include application of a 'glob top' on a device. For example, a 'glob-top' can be used for encapsulating a die that is wire bonded to a PCB. It is thinner than a QFN but takes up more surface area and its size is often unpredictable. It is difficult if not impossible to control the surface area it will use on the PCB because of its morphology (e.g., a gooey substance) and lack of tools to control its deposition.

Figure 5:
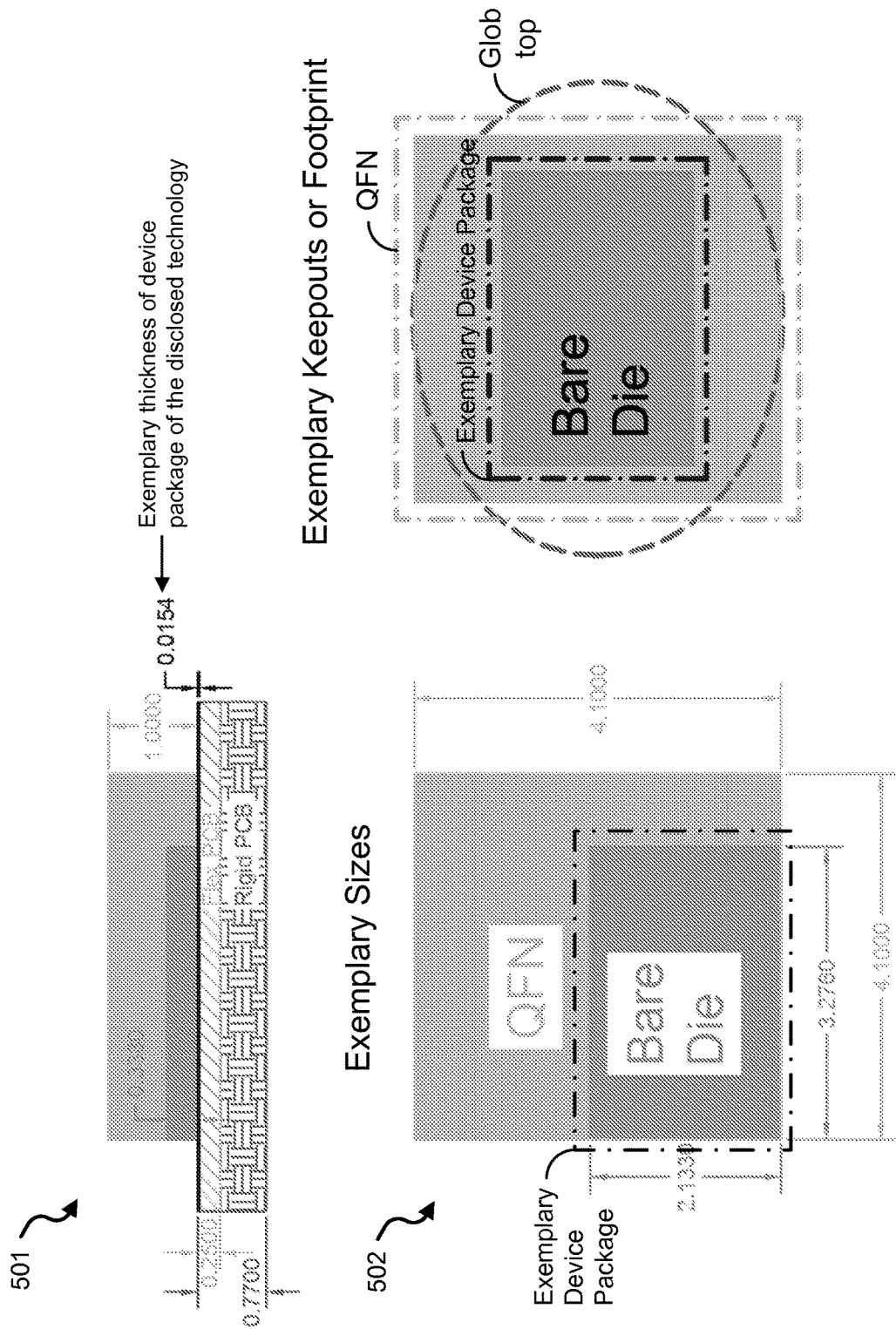
FIG. 5 shows diagrams comparing an electronic device fabricated using the disclosed technology with an electronic device fabricated using conventional methods.

FIG. 5 shows diagrams comparing an electronic device fabricated using the disclosed technology with an electronic device fabricated using conventional methods. Size dimensions in FIG. 5 are in millimeters. Diagram 501 depicts the ultra-thin height of an exemplary device package of the disclosed technology, e.g., 15.4 μm. In the example shown in diagram 501, the electronic components (e.g., bare die) have a height of 338 μm, the rigid PCB base has a height of 770 μm, and the flex PCB portion has a height of 250 μm. The ultra-thin (e.g., ~15 μm) device package of the disclosed technology is orders of magnitude thinner than a typical QFN package, which is depicted in FIG. 5 as around 1 mm. Diagram 502 depicts the miniature footprint of the exemplary device package of the disclosed technology, which can be made to be insubstantially larger than the footprint of the electronic components integrated into the device package (e.g., such as the bare die having a 2.133 mm×3.276 mm footprint in this example). The QFN has a footprint of 4.1 mm×4.1 mm. Diagram 503 depicts the relative footprints of the exemplary device package of the disclosed technology and QFN and glob top packaging, in which the exemplary device package of the disclosed technology is only slightly larger than that of the device components.

The disclosed device packaging approach saves more relative space (e.g., volume and 2D footprint) as microchips and other electronic components become more complex and include more pin-outs or input/output contacts, which would require more bond wires or metal pads for QFN in such conventional means. The disclosed device packaging technology can provide at least an 85% reduction in volume (and in some implementations, greater than 99% reduction in volume), and at least a 60% reduction in 2D footprint, e.g., in comparison with conventional technologies like QFN and glob top. For example, the device package substrate having a single interconnection layer can be configured to have a thickness less than 20 μm (e.g., such as ~15 μm as shown in FIG. 5), and in some implementations less than 10 μm. Also, for example, the disclosed device package substrate can be configured to have a 2D footprint that is ~10% greater than the electronic components on the substrate. In the example of diagram 502, the bare die includes a 2D footprint of 6.988 mm$^2$, in which the underlying device package substrate may be structured to be 100 μm or less outside the periphery of the bare die footprint (e.g., having a footprint of 8.11 mm$^2$ that is ~16% larger than that of the bare die).

The disclosed device fabrication and packaging technology can be utilized in applications where small volume and footprint of an electronic device are critical factors in the implementation of the device. For example, electronic devices fabricated by the disclosed methods to include an exemplary device packaging of the present technology can be utilized in devices and systems for sensing, processing, communication and actuation integrated into the Internet of Things. For example, the device packaging can be implemented using a flexible substrate configuration (e.g., where the produced electronic circuit or device is released from the template) or an inflexible substrate configuration (e.g., where the produced electronic circuit or device is encased in the template) for any applications that require small size. Examples can include use in circuits used in smartphone or tablet, in which the disclosed device packaging can reduce the size of the such circuits, and thereby the overall mobile communications device. Furthermore, for example, the device packaging can be implemented using either the flexible or inflexible substrate configuration in which the device packaging encapsulates the device, which can protect the device from detrimental conditions caused by moisture, temperature, pressure, acidity/basic, or other harmful conditions. Also, for example, the device packaging can be implemented using the flexible substrate configuration for appropriate applications that require small size and bendability or stretchability (e.g., such as a wearable device, in vivo device, etc.), or attachment to curved, irregularly shaped, or non-flat or moving devices.

EXAMPLES

The following examples are illustrative of several embodiments of the present technology. Other exemplary embodiments of the present technology may be presented prior to the following listed examples, or after the following listed examples.

In an example of the present technology (example 1), a method to fabricate a circuit or electronic device includes attaching an electronic component at a location on a substrate including a flexible and electrically insulative material, in which the substrate includes a flat surface opposite to that which the electronic component is attached; forming a template to encase the electronic component attached to the substrate by depositing a material in a phase to conform on the surfaces of the electronic component and the substrate, and causing the material to change to a solid form; and producing the circuit or electronic device by forming openings in the substrate to expose conductive portions of the electronic component, creating electrical interconnections coupled to at least some of the conductive portions in a particular arrangement on the substrate, and depositing a layer of an electrically insulative and flexible material over the electrical interconnections on the substrate to form a flexible base of the circuit, in which the produced circuit or electronic device is encased in the template.

Example 2 includes the method as in example 1, in which the electronic component includes at least one of a circuit element, circuit, or a microchip.

Example 3 includes the method as in example 2, in which the conductive portions includes contact pads of the circuit or the microchip.

Example 4 includes the method as in example 2, in which the microchip includes one or more of a bare die microchip or thin film microchip.

Example 5 includes the method as in example 2, in which the circuit includes one or more of an integrated circuit, thin film circuit, sensor circuit, transducer circuit, amplifier circuit, power converter circuit, or optocoupler circuit.

Example 6 includes the method as in example 2, in which the circuit element includes one or more of a diode, light-emitting diode (LED), transistor, battery, or impedance element.

Example 7 includes the method as in example 1, in which the attached electronic component includes a plurality of electronic components attached at predetermined locations based on a design of the produced circuit or electronic device.

Example 8 includes the method as in example 1, in which the template includes a flat base surface that is the surface opposite to that which the electronic component is encased.

Example 9 includes the method as in example 1, in which the attaching the electronic component on the substrate includes orienting the electronic component such that the conductive portions of the electronic component are in contact with the substrate.

Example 10 includes the method as in example 1, further including placing the substrate having the electronic component attached thereon in a well that includes an area greater than that of the substrate and includes a height equal to or greater than a combined height of the electronic component attached on the substrate, in which the placement is oriented such that the substrate is at the bottom of the well and the electronic component is facing the opening of the well.

Example 11 includes the method as in example 10, in which the forming the template includes applying an upper substrate having a flat surface against the deposited material in the phase to conform to the surfaces to produce a flat surface of the template in the solid form.

Example 12 includes the method as in example 11, further including removing, from the well, the template that encases the electronic component attached to the substrate; and placing the template that encases the electronic component on a flat surface oriented such that the substrate is upward and the template is in contact with the flat surface.

Example 13 includes the method as in example 1, in which the forming the template includes first depositing the material in the phase to conform to the surfaces on an external surface or in a well, and submerging the electronic component attached on the substrate into the deposited material such that the material conforms on the surfaces of the electronic component.

Example 14 includes the method as in example 1, in which the flexible and electrically insulative material includes at least one of polyimide, silicone-base elastomers, benzocyclobutane (BCB), SU-8, or elastomer containing additive conductive particles including carbon particles, carbon nanotubes, or Si nanowires.

Example 15 includes the method as in example 1, further including depositing an additional adhesion layer on the substrate prior to the attaching of the electronic component on the substrate.

Example 16 includes the method as in example 1, further including releasing the produced circuit or electronic device from the template.

Example 17 includes the method as in example 16, further including integrating the produced circuit or electronic device to a printed circuit board.

Example 18 includes the method as in example 16, further including forming an outer substrate including an electrically insulative material over the produced circuit or electronic device on the side having the electronic component.

Example 19 includes the method as in example 16, further including fabricating another circuit or electronic device using the released template, in which the template includes a cavity formed by the electronic component from the template forming process, and in which the fabricating another circuit or electronic device includes: placing an electronic component in the cavity of the template; forming a substrate including a flexible and electrically insulative material over a receiving surface of the template including the electronic component placed in the cavity to attach the electronic component to the substrate, in which the substrate includes a flat surface opposite to that which the electronic component is attached; and producing the another circuit or electronic device by forming openings in the substrate to expose conductive portions of the electronic component, creating electrical interconnections coupled to at least some of the conductive portions in a particular arrangement on the substrate, and depositing a layer of an electrically insulative and flexible material over the electrical interconnections on the substrate to form a flexible base of the circuit, in which the another produced circuit or electronic device is encased in the template and capable of being released from the template.

Example 20 includes the method as in example 1, further including integrating the template-encased circuit or electronic device to a printed circuit board.

Example 21 includes the method as in example 1, in which the producing the circuit or electronic device further includes fabricating electronic elements on the substrate, and creating additional electrical interconnections to electrically couple at least some of the electronic elements with the electronic component or the electrical interconnections.

Example 22 includes the method as in example 21, in which the electronic elements include at least one of a diode, light-emitting diode (LED), transistor, battery, impedance element, an integrated circuit, a thin film circuit, a sensor, a transducer, an amplifier, a power converter, an optocoupler, or a microchip.

In another example of the present technology (example 23), an electronic device packaging includes a substrate including a flexible and electrically insulative material, the substrate structured to adhere one or more electronic components on a side of the substrate and to include openings spanning from the side into an interior region of the substrate, in which the openings are arranged to align to locations where conductive contacts of the one or more electronic components are designed to be positioned; and interconnection wires including an electrically conductive material, the interconnection wires disposed in the openings and the interior region of the substrate in a particular arrangement based on a device design to electrically connect the one or more electronic components, in which the substrate is structured to have a thickness less than 20 μm.

Example 24 includes the electronic device packaging as in example 23, in which the one or more electronic components to adhere to the substrate include at least one of a circuit element, circuit, or a microchip.

Example 25 includes the electronic device packaging as in example 24, in which the circuit includes one or more of an integrated circuit, thin film circuit, sensor circuit, transducer circuit, amplifier circuit, power converter circuit, or optocoupler circuit.

Example 26 includes the electronic device packaging as in example 24, in which the circuit element includes one or more of a diode, light-emitting diode (LED), transistor, battery, or impedance element.

Example 27 includes the electronic device packaging as in example 24, in which the microchip includes one or more of a bare die microchip or thin film microchip.

Example 28 includes the electronic device packaging as in example 27, in which the substrate is structured to have length in a plane that includes the side that is larger than the corresponding length of the bare die microchip by 200 μm or less.

Example 29 includes the electronic device packaging as in example 23, in which the flexible and electrically insulative material includes at least one of polyimide, silicone-base elastomers, benzocyclobutane (BCB), SU-8, or elastomer containing additive conductive particles including carbon particles, carbon nanotubes, or Si nanowires.

Example 30 includes the electronic device packaging as in example 23, in which the interconnection wires are configured in a planar layer in the interior region, and the electronic device packaging further includes: a second layer of additional interconnection wires disposed in the interior region of the substrate and electrically coupled to at least some of the interconnection wires, in which the second layer is structured to have a thickness less than 15 μm such that the thickness of the substrate is less than 35 μm.

Example 31 includes the electronic device packaging as in example 23, further including electronic elements disposed in the interior region of the substrate or on an outer surface of the substrate, in which the interconnection wires are arranged to electrically couple at least some of the electronic elements with the electronic component or the electrical interconnections.

Example 32 includes the electronic device packaging as in example 31, in which the electronic elements include at least one of a diode, light-emitting diode (LED), transistor, battery, impedance element, an integrated circuit, a thin film circuit, a sensor, a transducer, an amplifier, a power converter, an optocoupler, or a microchip.

Example 33 includes the electronic device packaging as in example 23, further including a template structure including an electrically insulative material and structured to include a contact side to attach to the side of the substrate, in which the template structure includes one or more cavities formed on the contact side in particular positions to encompass the corresponding one or more electronic components to be adhered on the substrate.

In another example of the present technology (example 34), a method to fabricate a circuit or electronic device includes placing an electronic component in a cavity on a first side of a template, in which the cavity of the template is structured to have substantially the same geometry as the electronic component, and in which the placing encases the electronic component in the cavity such that conductive portions of the electronic component are exposed and the first side is flat; forming a substrate including a flexible and electrically insulative material on the first side of the template including the electronic component placed in the cavity to attach the electronic component to the substrate, in which the substrate includes a flat surface opposite to that which the electronic component is attached; and producing the circuit or electronic device by forming openings in the substrate to expose conductive portions of the electronic component, creating electrical interconnections coupled to at least some of the conductive portions in a particular arrangement on the substrate, and depositing a layer of an electrically insulative and flexible material over the electrical interconnections on the substrate to form a flexible base of the circuit, in which the produced circuit or electronic device is encased in the template.

Example 35 includes the method as in example 34, in which the electronic component includes at least one of a circuit element, circuit, or a microchip.

Example 36 includes the method as in example 34, in which the attached electronic component includes a plurality of electronic components attached at predetermined locations based on a design of the produced circuit or electronic device.

Example 37 includes the method as in example 34, in which the flexible and electrically insulative material of the substrate is an optically curable material, and the forming the substrate includes depositing the optically curable material to form a layer on the first side of the template and applying an optical signal at the optically curable material layer to cause the optically curable material to solidify.

Example 38 includes the method as in example 37, in which the optical signal is selected to have a wavelength in the ultraviolet spectrum.

Example 39 includes the method as in example 34, in which the flexible and electrically insulative material of the substrate is a thermally curable material, and the forming the substrate includes depositing the thermally curable material to form a layer on the first side of the template and applying heat to the layer to cause the thermally curable material to solidify.

Example 40 includes the method as in example 39, in which the applied heat includes 250° C.

Example 41 includes the method as in example 34, further including forming a mold master structure by attaching a model component having the same geometry as the electronic component to a base structure in a location where the electronic component is to be positioned on the substrate; and depositing a material in a phase to conform on the surfaces of the model component and the base, and causing the material to change to solid form to produce the template.

Example 42 includes the method as in example 34, in which the flexible and electrically insulative material includes at least one of polyimide, silicone-base elastomers, benzocyclobutane (BCB), SU-8, or elastomer containing additive conductive particles including carbon particles, carbon nanotubes, or Si nanowires.

Example 43 includes the method as in example 34, further including releasing the produced circuit or electronic device from the template.

Example 44 includes the method as in example 43, further including integrating the produced circuit or electronic device to a printed circuit board.

Example 45 includes the method as in example 34, further including forming an outer substrate including an electrically insulative material over the produced circuit or electronic device on the side having the electronic component, in which the outer substrate is capable to protect the produced circuit or device from detrimental conditions caused by moisture, temperature, pressure, or pH.

Example 46 includes the method as in example 34, further including fabricating another circuit or electronic device using the released template.

Example 47 includes the method as in example 34, further including integrating the template-encased circuit or electronic device to a printed circuit board.

Example 48 includes the method as in example 34, in which the producing the circuit or electronic device further includes fabricating electronic elements on the substrate, and creating additional electrical interconnections to electrically couple at least some of the electronic elements with the electrical component or the electrical interconnections.

Example 49 includes the method as in example 48, in which the additional electronic elements include at least one of a diode, light-emitting diode (LED), transistor, battery, impedance element, an integrated circuit, a thin film circuit, a sensor, a transducer, an amplifier, a power converter, an optocoupler, or a microchip.

In another example of the present technology (example 50), a method to fabricate a circuit includes attaching electronic components at selected locations on a substrate including a flexible and electrically insulative material; forming a cast to encase the electronic components attached to the substrate by depositing a casting material in a fluidic form to conform on the surfaces of the electronic components and the substrate, and allowing the casting material to change from the fluidic form to solid form; forming a circuit by forming openings in the substrate to conductive portions of the electronic components, creating electrical interconnections between the conductive portions in a selected arrangement over the substrate, and depositing a layer of an electrically insulative and flexible material over the electrical interconnections and exposed substrate to form a flexible and insulative base of the circuit; and releasing the circuit from the cast.

Example 51 includes the method as in example 50, in which the electronic components include one or more of a circuit element or a microchip.

Example 52 includes the method as in example 51, in which the conductive portions includes contact pads of the circuit element or the microchip.

Example 53 includes the method as in example 50, in which the attaching includes applying the conductive portions of the electronic components in contact with the substrate.

Example 54 includes the method as in example 50, further including placing the substrate having the electronic components attached thereon in a well of a molding substrate, in which the placement is oriented such that the substrate is at the bottom of the well and the electronic components are facing the opening of the well.

Example 55 includes the method as in example 54, further including applying an upper substrate having a flat surface against the deposited casting material to produce a flat surface of the cured cast.

Example 56 includes the method as in example 55, further including removing the cast encasing the electronic components attached to the substrate; and placing the cast on a flat surface oriented such that the substrate is upward and the solid cast material is in contact with the flat surface.

Example 57 includes the method as in example 50, in which the depositing the casting material includes submerging the electronic components attached on the substrate in the casting material in the fluidic form.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:
1. An electronic device packaging, comprising:
a substrate formed from a material that is both flexible and electrically insulative, wherein the substrate includes a side on which one or more electronic components can adhere wherein the substrate includes openings spanning from the side into an interior region of the substrate, and wherein the openings are arranged to align to locations where conductive contacts of the one or more electronic components are designed to be positioned;

interconnection wires including an electrically conductive material, the interconnection wires disposed in the openings and the interior region of the substrate in a particular arrangement based on an electronic device design to electrically connect the one or more electronic components, wherein an interconnection portion of the interconnection wires are configured in a planar layer in the interior region;

a second layer of additional interconnection wires disposed in the interior region of the substrate and electrically coupled to at least some of the interconnection wires, wherein an additional interconnection portion of the additional interconnection wires are configured in a second planar layer in the interior region; and a circuit element disposed in the interior region of the substrate at the planar layer or the second planar layer and in electrical connection with at least one interconnection wire of the interconnection wires, the circuit element including one or more of a resistor, capacitor, inductor, antenna, or transmission line, wherein the substrate is structured to have a thickness less than 35 μm.

2. The electronic device packaging as in claim 1, wherein the one or more electronic components to adhere to the substrate include a second circuit element, a circuit, or a microchip.

3. The electronic device packaging as in claim 2, wherein, when the one or more electronic components includes the circuit, the circuit includes an integrated circuit, a thin film circuit, a sensor circuit, a transducer circuit, an amplifier circuit, a power converter circuit, or an optocoupler circuit.

4. The electronic device packaging as in claim 2, wherein, when the one or more electronic components includes the second circuit element, the second circuit element includes a diode, a light-emitting diode (LED), a transistor, a battery, or an impedance element.

5. The electronic device packaging as in claim 2, wherein, when the one or more electronic components includes the microchip, the microchip includes a bare die microchip or a thin film microchip.

6. The electronic device packaging as in claim 1, wherein the flexible and electrically insulative material includes polyimide, silicone-base elastomers, benzocyclobutane (BCB), SU-8, or elastomer containing additive conductive particles including carbon particles, carbon nanotubes, or Si nanowires.

7. The electronic device packaging as in claim 1, further comprising:

a template structure including an electrically insulative material and structured to include a contact side to attach to the side of the substrate, wherein the template structure includes one or more cavities formed on the contact side in particular positions to encompass the corresponding one or more electronic components to be adhered on the substrate.

8. The electronic device packaging as in claim 7, wherein a second side of the template structure opposite the contact side of the template structure is a flat surface.

9. The electronic device packaging as in claim 1, wherein the substrate includes an optically cured polymer.

10. The electronic device packaging as in claim 1, wherein the interconnection wires include an active electronic component.

11. An electronic device packaging, comprising:

a substrate formed from a material that is both flexible and electrically insulative, wherein the substrate includes a side on which one or more electronic components can adhere, wherein the substrate includes openings spanning from the side into an interior region of the substrate, and wherein the openings are arranged to align to locations where conductive contacts of the one or more electronic components are designed to be positioned;

interconnection wires including an electrically conductive material, the interconnection wires disposed in the openings and the interior region of the substrate in a particular arrangement based on an electronic device design to electrically connect the one or more electronic components, wherein an interconnection portion of the interconnection wires are configured in a planar layer in the interior region;

a second layer of additional interconnection wires disposed in the interior region of the substrate and electrically coupled to at least some of the interconnection wires, wherein an additional interconnection portion of the additional interconnection wires are configured in a second planar layer in the interior region; and a circuit element disposed in the interior region of the substrate at the planar layer or the second planar layer and in electrical connection with at least one interconnection wire of the interconnection wires, the circuit element including one or more of a resistor, capacitor, inductor, antenna, or transmission line, wherein the substrate is structured to have a thickness less than 35 μm wherein the electronic device packaging has a two-dimensional footprint that is 100 μm or less outside of a footprint of the one or more electronic components that can adhere to the side of the substrate.

12. The electronic device packaging as in claim 11, wherein the one or more electronic components to adhere to the substrate include a second circuit element, a circuit, or a microchip.

13. The electronic device packaging as in claim 12, wherein, when the one or more electronic components includes the circuit, the circuit includes an integrated circuit, a thin film circuit, a sensor circuit, a transducer circuit, an amplifier circuit, a power converter circuit, or an optocoupler circuit.

14. The electronic device packaging as in claim 12, wherein, when the one or more electronic components includes the second circuit element, the second circuit element includes a diode, a light-emitting diode (LED), a transistor, a battery, or an impedance element.

15. The electronic device packaging as in claim 12, wherein, when the one or more electronic components includes the microchip, the microchip includes a bare die microchip or a thin film microchip.

16. The electronic device packaging as in claim 11, wherein the flexible and electrically insulative material includes polyimide, silicone-base elastomers, benzocyclobutane (BCB), SU-8, or elastomer containing additive conductive particles including carbon particles, carbon nanotubes, or Si nanowires.

17. The electronic device packaging as in claim 11, further comprising:

a template structure including an electrically insulative material and structured to include a contact side to attach to the side of the substrate, wherein the template structure includes one or more cavities formed on the contact side in particular positions to encompass the corresponding one or more electronic components to be adhered on the substrate.

18. The electronic device packaging as in claim 17, wherein a second side of the template structure opposite the contact side of the template structure is a flat surface.

19. The electronic device packaging as in claim 11, wherein the substrate includes an optically cured polymer.

20. The electronic device packaging as in claim 11, wherein the interconnection wires include an active electronic component.

* * * * *